(12) United States Patent
Fuchsloch et al.

(10) Patent No.: US 11,604,167 B2
(45) Date of Patent: Mar. 14, 2023

(54) DIFFERENTIAL PROBE, TESTING DEVICE AND PRODUCTION METHOD

(71) Applicant: Prüftechnik Dieter Busch GmbH, Ismaning (DE)

(72) Inventors: Bernd Fuchsloch, Weil im Schönbuch (DE); Jürgen Peters, Pliening (DE)

(73) Assignee: PRÜFTECHNIK DIETER BUSCH GMBH, Ismaning (DE)

( * ) Notice: Subject to any disclaimer, the term of this patent is extended or adjusted under 35 U.S.C. 154(b) by 0 days.

(21) Appl. No.: 16/603,511

(22) PCT Filed: Apr. 4, 2018

(86) PCT No.: PCT/EP2018/058536
§ 371 (c)(1),
(2) Date: Oct. 7, 2019

(87) PCT Pub. No.: WO2018/189000
PCT Pub. Date: Oct. 18, 2018

(65) Prior Publication Data
US 2020/0041453 A1    Feb. 6, 2020

(30) Foreign Application Priority Data
Apr. 10, 2017    (DE) .................... 10 2017 107 708.1

(51) Int. Cl.
*G01N 27/90*    (2021.01)
*G01N 27/9013*    (2021.01)
(Continued)

(52) U.S. Cl.
CPC ....... *G01N 27/9006* (2013.01); *G01N 27/902* (2013.01); *G01N 27/904* (2013.01); *G01R 33/02* (2013.01); *G01R 33/12* (2013.01)

(58) Field of Classification Search
CPC ............. G01N 27/9006; G01N 27/902; G01N 27/904; G01N 27/87; G01R 33/02; G01R 33/12; G01R 31/00; H01F 5/003
See application file for complete search history.

(56) References Cited

U.S. PATENT DOCUMENTS 3,504,276 A * 3/1970 Beaver .................... H01F 5/003
324/260
3,900,793 A    8/1975 Mansson
(Continued)

FOREIGN PATENT DOCUMENTS

DE        69221367 T2    3/1998
DE    202013103151 U1    10/2013
(Continued)

OTHER PUBLICATIONS

Ralf Ph. Schmidt; Inductive sensor; Nov. 27, 2014; iCONTROLS ks; DE 10 2013 209 808 A1; G01N27/90 (Year: 2014).*
(Continued)

*Primary Examiner* — Nasima Monsur
(74) *Attorney, Agent, or Firm* — Aird & McBurney LP

(57) ABSTRACT

Disclosed herein is a differential probe, a testing device having at least one such differential probe, and a method for producing the same. The differential probe has a first half-probe and a second half-probe, at least one conductor loop pair having a conductor loop of each half-probe being shaped mirror-inverted relative to each other and, in respect of a mirror-inverted arrangement thereof on respective sides of a mirror plane. The conductor loops are oriented parallel to the mirror plane, are arranged offset relative to each other in an offset direction, also parallel to the mirror plane, wherein the conductor loops overlap in part in the direction normal to the mirror plane.

16 Claims, 2 Drawing Sheets

Figure 1:
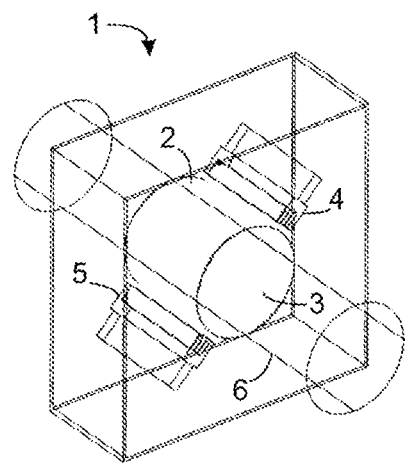

(51) Int. Cl.
*G01N 27/904* (2021.01)
*G01R 33/02* (2006.01)
*G01R 33/12* (2006.01)

(56) References Cited

U.S. PATENT DOCUMENTS

| | | | |
|---|---|---|---|
| 4,873,757 A | 10/1989 | Williams | |
| 5,196,796 A * | 3/1993 | Misic | A61B 5/055 324/322 |
| 5,506,503 A | 4/1996 | Cecco et al. | |
| 5,659,248 A * | 8/1997 | Hedengren | G01N 27/9013 336/200 |
| 8,988,071 B2 | 3/2015 | De Smet | |
| 9,322,806 B2 | 4/2016 | Bureau | |
| 2004/0021461 A1 | 2/2004 | Goldfine et al. | |
| 2007/0159170 A1 * | 7/2007 | Freytag | G01R 33/34069 324/318 |
| 2010/0085045 A1 | 4/2010 | Sheila-Vadde et al. | |
| 2010/0312494 A1 | 12/2010 | Korukonda et al. | |
| 2011/0057629 A1 | 3/2011 | Lin et al. | |
| 2013/0106409 A1 | 5/2013 | Wang et al. | |

FOREIGN PATENT DOCUMENTS

| | | |
|---|---|---|
| DE | 102013209808 A1 | 11/2014 |
| DE | 102013216019 A1 | 2/2015 |
| DE | 102014212499 A1 | 12/2015 |
| EP | 1600769 A1 | 11/2005 |
| EP | 1674860 A2 | 6/2006 |
| EP | 2133691 A2 | 12/2009 |
| EP | 2866026 A1 | 4/2015 |
| GB | 2262607 B | 6/1996 |
| JP | 63-311165 A | 12/1988 |
| JP | H04-116493 A | 4/1992 |
| JP | H09-033488 A | 1/1997 |
| JP | 2001-305108 A | 10/2001 |
| JP | 2002-62280 A | 2/2002 |
| JP | 2005-221273 A | 8/2005 |
| JP | 2009-008659 A | 1/2009 |
| JP | 2011-517338 A | 6/2011 |
| JP | 2013-072754 A | 4/2013 |
| JP | 2013-104761 A | 5/2013 |
| JP | 2015-081815 A | 4/2015 |
| WO | 2003-091655 A1 | 11/2003 |
| WO | 2003-091656 A1 | 11/2003 |
| WO | 2014/191351 A2 | 12/2014 |
| WO | 2015022210 A1 | 2/2015 |
| WO | 2016-080947 A1 | 5/2016 |
| WO | 2016080947 A1 | 5/2016 |

OTHER PUBLICATIONS

Notice of Reasons for Refusal, JP application No. 2019-551356 dated Oct. 13, 2020.
Search Report for German Patent Application No. 10 2017 107 708.1 dated Feb. 16, 2018.
International Search Report and Written Opinion for PCT/EP2018/058536 dated Jun. 20, 2018.
Office Action for IN application No. 201927044217 dated Feb. 10, 2021.

* cited by examiner

DIFFERENTIAL PROBE, TESTING DEVICE AND PRODUCTION METHOD

The present invention relates to a differential probe having a first half-probe and a second half-probe, the differential probe comprising at least one conductor loop pair having a first conductor loop of the first half-probe and a second conductor loop of the second half-probe, and, in particular, relates to a differential probe for the inspection of test pieces or semi-finished products for flaws, such as cracks and cavities. The invention further relates to a testing device having at least one such differential probe and at least one through opening for test pieces, around which the differential probe can be rotated. Finally, the invention relates to a method for producing a differential probe in which conductor loops of the half-probes are formed on circuit boards.

Testing devices or testing instruments that are designed as rotary systems are used for the inspection of semi-finished products for flaws, such as cracks and cavities, by means of eddy current methods or leakage flux methods. In rotary systems of this kind, probe apparatus is arranged at rotatable rotary heads of the testing instrument. When the rotary head, together with the probe apparatus arranged on it, is rotated, while an elongated test piece is inserted through a central passage opening all the way through the rotary head, the probe apparatus moves relative to the test piece on a screw-shaped path. In order to be able to detect changes in the magnetic field resulting from flawed sites in the test piece, it is necessary for the provided probes of the probe apparatus in the eddy current method to be situated at a predetermined distance or as close as possible to the surface of the test piece. In the leakage flux method, in contrast, the probes are in contact with the test piece and rub against the surface thereof.

A defect delivers the maximum possible signal when the entire probe is completely covered. A short defect or a partial covering of the probe produces smaller flaw signals. Because, during the measurement, the test piece undergoes translational movement while the rotary head rotates around the test piece, the minimum flaw length of a defect, that is, the shortest length that a defect in the test piece may have in order to be recognized as such, depends on the speed of rotation and the speed of advance or linear speed of the test piece during the measurement. In order to improve the effectiveness of such rotary systems and to increase the throughput speed of the test pieces and, nonetheless, to be able to register defects with short minimum flaw lengths, it is known to use, instead of individual probes, probe systems having a plurality of successively arranged probes. The probes are thereby preferably designed as differential probes in order to reduce interfering influences of signal emitters.

Known, for example, from US 2010/0312494 A1 and EP 1 600 769 A1 are differential probes that can be used in the eddy current method. The differential probes each have two half-probes that are arranged next to each other and have conductor loops that bound respective surfaces, wherein the bound surfaces are arranged in the same plane or in parallel planes.

Known further from US 2011/0057629 A1 is a stacked arrangement of printed circuit boards having strip conductors formed or printed on them as conductor loops. As a result of the stacking, the surfaces bound by the strip conductors exist in an aligned arrangement with one another. By means of stacked circuit boards of this kind and the conductor loops formed on them, it is possible to create, for example, two coils, which each have different directions of winding. These two coils thus form two half-probes of a differential probe, with one circuit board core ensuring the desired distance between the half-probes in order to obtain a specific effective width of the differential probe. After pressing the two half-probes to the circuit board core, the finished differential probe is obtained.

It is known how to reduce minimum flaw lengths of rotary systems or testing devices by suitably combining differential probes of reduced length. If, for example, the length of a differential probe is halved and if two neighboring differential probes are connected in parallel, then it is necessary for defects of the test piece to cover probes that are only half as long in order for the defects to be detected. In consequence of this, the minimum flaw length of rotary systems or testing devices can be halved. However, the internal resistance of non-active differential probes is introduced as a voltage divider into differential probes connected in this way, so that a signal level delivered by differential probes is also halved. Therefore, differential probes connected in parallel in this way exhibit a behavior that is identical to that of a single differential probe with a length corresponding to that of the two differential probes connected in parallel and, in turn, necessitate complex electronics in order to compensate for this behavior.

Therefore, the object of the present invention is to create a differential probe that is simple to produce, a testing device having a differential probe of this kind, and a production method for a differential probe of this kind, so that, given a minimum flaw length that remains constant and without any loss in accuracy of the analysis, the linear speed of test pieces can be increased.

This object is achieved by the differential probe having the features of claim 1, by the testing device having the features of claim 5, and by the method having the features of claim 8. Preferred embodiments are the subject of the dependent claims.

In the differential probe according to the invention, the first conductor loop and the second conductor loop of the conductor loop pair are shaped as mirror images to each other, and, with respect to a mirror-image or minor-inverted arrangement thereof, on respective sides of an imaginary mirror plane, wherein the first conductor loop and the second conductor loop are oriented parallel to the mirror plane and are arranged offset relative to each other in an offset direction also parallel to the mirror plane, wherein the first conductor loop and the second conductor loop overlap in part in the direction normal to the mirror plane. In particular, the first half-probe and the second half probe, which are arranged on respective sides of the mirror plane, or the first conductor loop and second conductor loop can additionally be arranged offset relative to each other in the direction normal to the mirror plane or can each be spaced apart from the minor plane situated between the two conductor loops. A first surface enclosed or bounded by the first conductor loop and a second surface enclosed or bounded by the second conductor loop are thereby oriented parallel to each other or parallel to the mirror plane. As a consequence of the offset arrangement of the two conductor loops and, in particular, of the two half-probes in the offset direction parallel to the minor plane, a surface of the test piece or test material scanned by the differential probe is enlarged. The differential action of the differential probe, the first half-probe and second half-probe of which or the first conductor loop and second conductor loop of which can be operated in a so-called difference circuit, is thereby maintained.

Quite generally, the differential probe according to the invention can be used both for testing by means of the eddy current method and for testing by means of the leakage flux method. Furthermore, the first and second conductor loops can be fabricated from the same materials or metals or from different materials or metals and can be electrically conductive. Beyond this, the first conductor loop and the second conductor loop can bound or enclose the first surface and the second surface completely or else only in part.

Preferably, the differential probe has a plurality of conductor loop pairs, in which all first conductor loops are aligned with one another and all second conductor loops are aligned with one another. Each conductor loop pair thereby has a first conductor loop of the first half-probe and a second conductor loop of the second half-probe that is shaped mirror-inverted relative to the former. Advantageously, the plurality of first conductor loops and the plurality of second conductor loops are joined to one another or connected to one another in an electrically conductive manner as respective coils with different or opposite directions of winding. In this way, the first half-probe and the second half-probe in this embodiment act like differently wound coils.

Although the first and second conductor loops are fundamentally of any arbitrary shape and, for example, can be circular, oval, square, or rectangular, the first and second conductor loops are preferably of rectangular shape. Especially preferred, the first conductor loop and the second conductor loop have respective conductor portions that are straight in shape and are parallel to the offset direction. During operation of the differential probe, these conductor portions that are aligned straight and parallel to the offset direction advantageously face the test piece or the test material. If the differential probe is used in the eddy current method, these conductor portions are spaced apart from a surface of the test piece or from the test piece, whereas, during an operation of the differential probe in the leakage flux method, they are in contact with the surface of the test piece.

In the differential probe, the first surface, which is bounded by the first conductor loop, and the second surface, which is bounded by the second conductor loop, can overlap in part in the direction normal to the mirror plane or can be disjunct. Preferably, the first and second conductor loops or the first and the second half-probes are offset with respect to each other in the offset direction so far that the first surface and the second surface do not overlap in the direction normal to the mirror plane or are disjunct. In such cases, the parts or portions of the first and second conductor loops that overlap one another in the direction normal to the mirror plane form respective contiguous subportions of the respective conductor loops. If the two half-probes are pulled apart from each other, for example, by a full length of the half-probe or are displaced in the offset direction, then the first surface and the second surface are disjunct and the linear speed of the test piece can be doubled in this way. However, insofar as the first surface and the second surface overlap in the direction normal to the mirror plane or are not disjunct, the parts or portions of the first and second conductor loops that overlap one another in the direction normal to the mirror plane each form a plurality of non-contiguous subportions of the respective conductor loops.

In the testing device according to the invention, the differential probe is arranged in such a way that, during rotation of the differential probe, a central axis of the through opening extends essentially parallel to the mirror plane or within the mirror plane. Accordingly, the differential probe or its first and second half-probes or the first and second conductor loops are perpendicular to the direction of movement of the test piece. A testing device of this kind is suitable, in particular, for testing by the leakage flux method.

Because the first and second conductor loops are arranged on respective sides of a mirror plane, they are, on the one hand, arranged offset with respect to each other perpendicular to the direction of movement of the test piece and, furthermore, because they are arranged offset with respect to each other in an offset direction parallel to the mirror plane with respect to an arrangement thereof on respective sides of the mirror plane in which the first conductor loop and the second conductor loop are oriented parallel to the mirror plane, they are additionally arranged offset in the direction of movement of the test piece. The first surface and the second surface are thereby oriented parallel both to each other and to the mirror plane.

In order to scan over larger surfaces of the test piece and, in this way, to increase the speed of scanning of the test piece, it is possible to provide a plurality of differential probes for the testing device. In particular, two or a plurality of differential probes can be arranged in the testing device at essentially equal angular separations around the through opening.

Further preferred is a testing device in which at least two differential probes are arranged next to each other along the direction of shift or along a line parallel to the central axis. Such arrangements of differential probes also increase the speed of scanning of the test piece, because larger surfaces thereof are scanned by the differential probes.

In the method according to the invention for producing a differential probe, it has proven advantageous for both the first conductor loop and the second conductor loop to be formed on respective subportions of the same circuit board. In this way, false voltages, which can arise in known differential probes as a result of tolerances of the support materials and of the production process, can be prevented. The problem arising in known differential probes that, for the mentioned reasons, sensitivities of the probe are undesirably changed and different initial values are produced, depending on the point at which the differential probe passes a defect, is circumvented by differential probes produced using the method according to the invention.

The method according to the invention can be used to produce differential probes having a simple construction, which, nonetheless, allow the minimum flaw length to be reduced several fold, without having to increase the speed of rotation of the test piece. Defects with the minimum flaw length or longer are detected at each point under the differential probe with the same sensitivity. Flaw thresholds in an analysis software can be clearly adjusted in this way. Furthermore, production tolerances in the production of differential probes are minimized.

Through the additional insertion of material between the two subportions, it is possible to influence the effective width of the differential probe. The subportions can be bonded adhesively to each other. Preferably, however, electrical connections between the first and second conductor loops are used directly as mechanical connections between them. In the case of small effective widths, the subportions can be laid directly on each other, for example, and the electrical connections can be produced by means of solder. Owing to the resulting connection, the subportions are fixed in place with respect to each other. In the case of larger effective widths, it is possible, prior to the soldering, additionally to insert a mechanical element. In the simplest form, wires are soldered into the connections between the conductor loops and, at the same time, contribute both to the electrical connection and to the mechanical stabilization.

Preferably, in the first subportion, in addition, a first conductor loop or a second conductor loop of a further differential probe and, in the second subportion, in a corresponding manner, a second conductor loop or a first conductor loop of this further differential probe is formed. Fluctuations in the production of the circuit boards can be averaged out in this way. In systems having two conventionally produced differential probes that are connected in parallel, the failure of one differential probe cannot be detected in a straightforward manner, because the remaining differential probe continues to produce a baseline noise. If, however, the differential probes are produced in accordance with this embodiment of the method according to the invention, a failure of one of the differential probes can be detected by analysis software. In the event of failure due to disconnection, the entire signal is lost. In contrast, in the event of failure due to short circuit, the differential action of the probe and the resulting signal can clearly be recognized as erroneous.

Furthermore, the subportions are preferably provided with reference drill holes, by means of which the subportions can be positioned relative to each other. Mechanical elements or parts can pass in part or entirely through the reference drill holes in order to fix the position of the subportions relative to each other.

Figure 2:
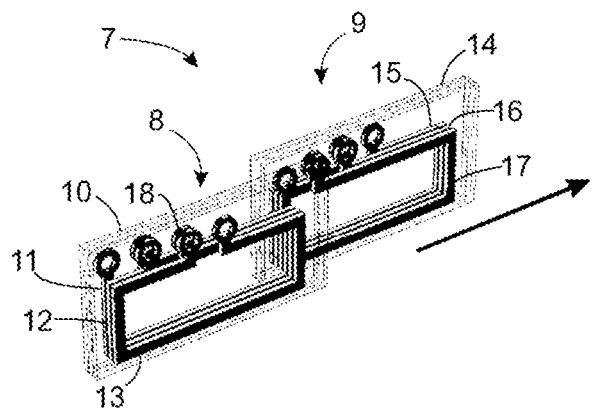
Figure 3:
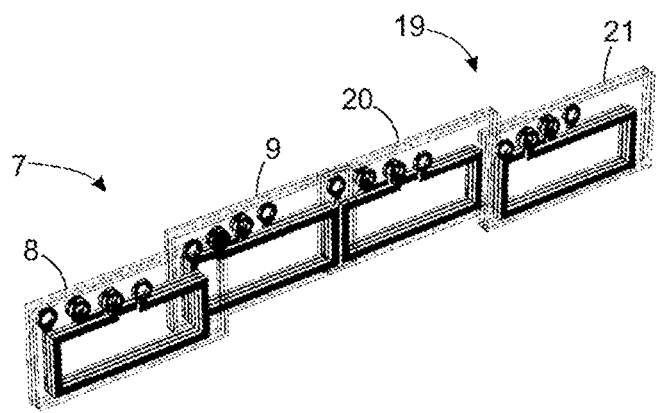
Figure 4A:
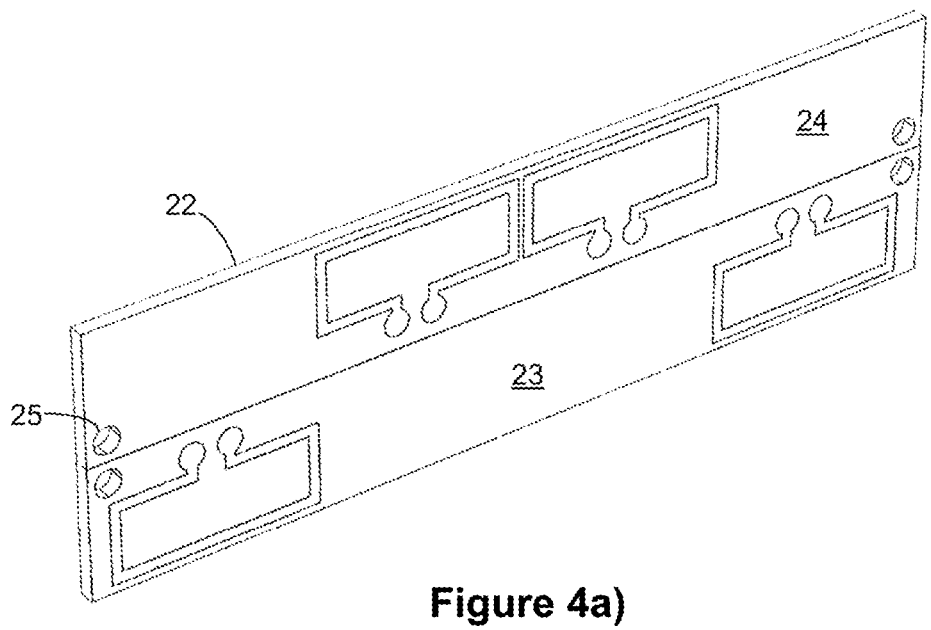
Figure 4B:
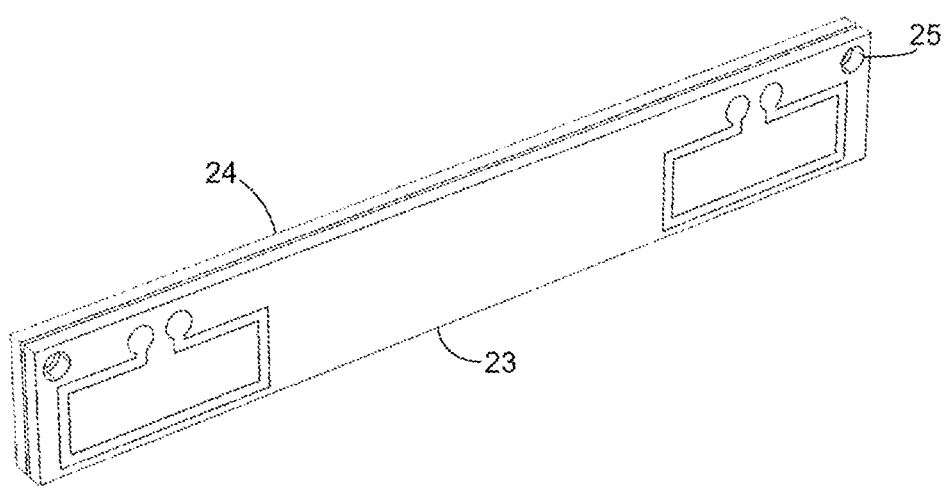

The invention will be explained in detail below on the basis of preferred exemplary embodiments with the aid of figures. Shown are:

FIG. 1 a highly simplified schematic illustration of a testing device;

FIG. 2 a differential probe;

FIG. 3 two differential probes;

FIG. 4a) a circuit board with printed conductor loops;

FIG. 4b) adjacently arranged subportions of the circuit board of FIG. 4a) after it has been divided.

Illustrated in FIG. 1 in a highly simplified schematic illustration for highlighting the function thereof is a testing device 1. The testing device has a rotatably mounted rotary head 2 with a through opening 3. Two probe devices 4 and 5 for leakage flux measurement are arranged diametrically at the rotary head 2. Each of the probe devices 4 and 5 can have one differential probe or a plurality of differential probes, such as described further below in detail in connection with FIGS. 2 and 3.

By means of the leakage flux measurement, which is known in and of itself, it is possible to detect material flaws in test pieces 6 that are pushed through the through opening 3 at a predetermined linear speed. For this purpose, the rotary head 2 is rotated at a predetermined speed of rotation, while the test piece 6 is advanced at a predetermined linear speed. In the present case, the test piece 6 is an elongated unit. Consequently, as a result of the relative movement between the rotary head 2 and the test piece 6, the probe devices 4 and 5 describe screw-shaped paths on the surface of the test piece 6 and scan the test piece 6 along these paths. If the linear speed of the test piece 6 and the speed of rotation of the rotary head 2 are adjusted accordingly, the entire surface of the test piece 6 can be scanned by the probe devices 4 and 5.

Seen in FIG. 2 is a differential probe 7 that can be inserted into the probe devices 4 and 5. The differential probe 7 has a first half-probe 8 and a second half-probe 9. A stack composed of three circuit boards 10, on which respective first conductor loops 11, 12, and 13 are formed in an aligned orientation, forms the first half-probe 8, while the second half-probe 9 is correspondingly formed from a stack composed of three circuit boards 14, on which respective second conductor loops 15, 16, and 17 are formed in an aligned orientation. The inner first conductor loop 11, which faces the second half-probe 9, and the inner second conductor loop 17, which faces the first half-probe 8 in this case form a first conductor loop pair, the middle first conductor loop 12 and the middle second conductor loop 16 form a second conductor loop pair, and the outer first conductor loop 13, which faces away from the second half-probe 9, and the second conductor loop 15, which faces away from the first half-probe 8, form a third conductor loop pair.

Each of the first conductor loops 11, 12, and 13 as well as each of the second conductor loops 15, 16, and 17 are shaped as an open rectangle and have a respective pair of contact end portions 18, with which an electrical contact to neighboring first conductor loops 11, 12, and 13 or second conductor loops 15, 16, and 17 can be produced. The distribution of the contact end portions 18 on the first conductor loops 11, 12, 13 and on the second conductor loops 15, 16, 17 is thereby such that, in an arrangement in which all first conductor loops 11, 12, 13 are aligned with all second conductor loops 15, 16, 17, the two half-probes 8 and 9 are shaped mirror-inverted relative to each other with respect to an imaginary mirror plane that is situated between the half-probes 8 and 9. This mirror-inverted shaping of the two half-probes 8 and 9 makes possible a conductive connection of the first conductor loops 11, 12, 13 to one another and of the second conductor loops 15, 16, 17 to one another in a way that corresponds to two coils, which each have different or opposite coil directions.

As can be seen in FIG. 2, however, the two half-probes 8 and 9 are arranged offset relative to each other in comparison to the above-described arrangement in which all first conductor loops 11, 12, 13 are aligned with all second conductor loops 15, 16, 17. More precisely, the half-probes 8 and 9 and thus their respective first conductor loops 11, 12, 13 and second conductor loops 15, 16, 17 are shifted in a direction parallel to this mirror plane, this shift being indicated in FIG. 2 by a straight arrow. Whereas respective first surfaces enclosed by the first conductor loops 11, 12, 13 are oriented aligned with each other and parallel to the mirror plane and, likewise, respective surfaces enclosed by the second conductor loops 15, 16, 17 are oriented aligned with each other and parallel to the mirror plane, there is no overlap of the first surfaces and of the second surfaces in a direction normal to the mirror plane. Only those peripheral portions of the first conductor loops 11, 12, 13 and of the second conductor loops 15, 16, 17 that are perpendicular to the direction of shift of the two half-probes 8 and 9 and face each other are arranged overlapped or stacked in a direction normal to the mirror plane.

After installation of the differential probe 7 in one of the probe devices 4 or 5, a central axis of the through opening 3 of the testing head 2, which is identical to its axis of rotation, lies essentially in the imaginary mirror plane described. With respect to the direction of shift of the two half-probes 8 and 9, parallel peripheral portions of the first conductor loops 11, 12, 13 and of the second conductor loops 15, 16, 17, at which the contact end portions 18 are provided, thereby face away from the through opening 3, whereas peripheral portions that are opposite to these peripheral portions with the contact end portions 18 face the through opening 3 and thus face the test piece 6.

The differential probe 7 can also be provided in combination with further, identically constructed differential probes in the probe devices 4 and 5.

For this purpose, FIG. 3 shows the differential probe 7 in combination with an identically constructed differential probe 19 having a first half-probe 20 and a second half-probe 21, which is arranged in extension of the differential probe 7 in the direction of shift next to it.

The described differential probe 7 and, in particular, the combination of the differential probe 7 and the differential probe 19 can be produced in an especially simple manner in that, as shown in FIG. 4a), one conductor loop of the first half-probe 8 and of the second half-probe 9 of the first differential probe 7 and one conductor loop of the first half-probe 20 and of the second half-probe 21 of the second differential probe 19 are formed at suitable positions on the same circuit board 22, but within different subportions 23 and 24 of the circuit board. Whereas, in the illustrated example, a first conductor loop of the first half-probe 8 and a second conductor loop of the second half-probe 21 are formed in a first subportion 23 of the circuit board 22, a second conductor loop of the second half-probe 9 and a first conductor loop of the first half-probe 20 are formed in a second subportion 24 of the circuit board 22 at positions that correspond to offsets of the conductor loops of the second half-probes 9 and 21 with respect to the first half-probes 8 and 20 in the finished differential probes 7 and 19. The second conductor loop of the second half-probe 9 and the first conductor loop of the first half-probe 20 are thereby formed in orientations on the second subportion 24 that, with respect to their orientations in the finished differential probes 7 and 19 or in the finished combinations of the differential probes 7 and 19, are rotated by 180° with respect to the axis of rotation parallel to the offset direction. Furthermore, reference drill holes 25 are provided in the subportions 23 and 24 of the circuit board 22 in order to facilitate a later alignment of the subportions 23 and 24.

After the circuit board 22 has been divided, whereby the subportions 23 and 24 are separated from each other, the two subportions 23 and 24 are arranged next to each other, whereby, in particular, the conductor loops formed on the second subportion 24 assume orientations that, with respect to the conductor loops formed on the first subportion 23, correspond to their orientations in the finished differential probes 7 and 19. In particular, one of the two subportions 23 and 24 is thereby rotated with respect to the respective other subportion 23 and 24 by 180° compared to the orientation of the relevant subportion 23 and 24 in the undivided circuit board 22.

When the subportions 23 and 24 are arranged next to each other, the reference drill holes 25 prove to be helpful. By bringing reference drill holes 25 of the two subportions 23 and 24 into alignment with each other, which can be done simply by inserting an element through the reference drill holes 25, it is conveniently possible to position the subportions 23 and 24 in the desired way. Finally, the subportions 23 and 24 are connected to each other. This can be conducted, for example, by adhesive bonding or in another mechanical way.

LIST OF REFERENCE NUMBERS 1. testing device
2. rotary head
3. through opening
4. probe device
5. probe device
6. test piece
7. differential probe
8. first half-probe
9. second half-probe
10. circuit board
11. first conductor loop
12. first conductor loop
13. first conductor loop
14. circuit board
15. second conductor loop
16. second conductor loop
17. second conductor loop
18. contact end portion
19. differential probe
20. first half-probe
21. second half-probe
22. circuit board
23. subportion
24. subportion
25. reference drill hole

The invention claimed is:

1. A test apparatus comprising:
at least one differential probe and at least one through opening for test pieces around which the at least one differential probe can be rotated,
wherein each of the at least one differential probe has a first half-probe, a second half-probe, and at least one conductor loop pair having a first conductor loop of the first half-probe and a second conductor loop of the second half-probe,
wherein the first conductor loop and second conductor loop are shaped mirror-inverted relative to each other and with respect to a mirror-inverted arrangement thereof on respective sides of a mirror plane,
wherein the first conductor loop and the second conductor loop are oriented parallel to the mirror plane and are arranged offset relative to each other in an offset direction also parallel to the mirror plane,
wherein the first conductor loop and the second conductor loop overlap in part in the direction normal to the mirror plane, and only along a plurality of non-contiguous subportions of the first and second conductor loops such that a first surface bounded by the first conductor loop and a second surface bounded by the second conductor loop are offset entirely from one another in the offset direction.

2. The test apparatus according to claim 1, having a plurality of conductor loop pairs, wherein all first conductor loops are aligned with one another in a first stack, and all second conductor loops are aligned with one another in a second stack.

3. The test apparatus according to claim 1, wherein the first conductor loop and the second conductor loop have respective straight conductor portions that are formed parallel to the offset direction.

4. The test apparatus according to claim 1, wherein, during the rotation of the at least one differential probe, a central axis of the through opening extends essentially parallel to the mirror plane or within the mirror plane.

5. The test apparatus according to claim 1, wherein the at least one differential probe comprises two or a plurality of differential probes that are arranged at essentially identical angular separations around the through opening.

6. The test apparatus according to claim 1, wherein the at least one differential probe comprises at least two differential probes that are arranged next to each other along the offset direction.

7. A method for producing a differential probe wherein the method comprises:
forming a first conductor loop in a first subportion of a flat circuit board,
forming a second conductor loop in a second subportion of the circuit board at a position that corresponds to an offset of the second conductor loop with respect to the first conductor loop in the differential probe, wherein the differential probe comprises a first half-probe, a second half-probe, and at least one conductor loop pair having the first conductor loop of the first half-probe and the second conductor loop of the second half-probe, wherein, in the differential probe, the first conductor loop and second conductor loop are shaped mirror-inverted relative to each other and with respect to a minor-inverted arrangement thereof on respective sides of a mirror plane, wherein, in the differential probe, the first conductor loop and the second conductor loop are oriented parallel to the minor plane and are arranged offset relative to each other in an offset direction also parallel to the mirror plane, wherein, in the differential probe, the first conductor loop and the second conductor loop overlap in part in the direction normal to the mirror plane, and only along a plurality of non-contiguous subportions of the first and second conductor loops such that a first surface bounded by the first conductor loop and a second surface bounded by the second conductor loop are offset entirely from one another in the offset direction;

wherein the second conductor loop is formed, in the second subportion of the circuit board, in an orientation that is rotated by 180° around an axis of rotation parallel to the offset direction in comparison to its orientation in the second half-probe, dividing the circuit board and thereby separating the first subportion and the second subportion from each other, arranging the second subportion next to the first subportion, whereby the second conductor loop is brought into its orientation in the second half-probe, and connecting the first subportion and the second subportion to each other.

8. The method according to claim 7, wherein, the method comprises forming, in the first subportion, in addition, a first conductor loop or a second conductor loop of a further differential probe and, in the second subportion, correspondingly, a second conductor loop or a first conductor loop of the further differential probe.

9. The method according to claim 7, wherein each of the first subportion of the circuit board and the second subportion of the circuit board is provided with reference drill holes, wherein the method comprises aligning the first and second subportions relative to each other by aligning the reference drill holes of the first subportion with the reference drill holes of the second subportion.

10. A method for detecting a material flaw in a test piece by a leakage flux method or an eddy current method, the method comprising:

placing the test piece in a through opening of a testing apparatus;

rotating at least one differential probe around the through opening, wherein each of the at least one differential probe has a first half-probe, a second half-probe, and at least one conductor loop pair having a first conductor loop of the first half-probe and a second conductor loop of the second half-probe, wherein the first conductor loop and second conductor loop are shaped mirror- inverted relative to each other and with respect to a mirror-inverted arrangement thereof on respective sides of a mirror plane, wherein the first conductor loop and the second conductor loop are oriented parallel to the mirror plane and are arranged offset relative to each other in an offset direction also parallel to the mirror plane, wherein the first conductor loop and the second conductor loop overlap in part in the direction normal to the mirror plane, and only along a plurality of non-contiguous subportions of the first and second conductor loops such that a first surface bounded by the first conductor loop and a second surface bounded by the second conductor loop are offset entirely from one another in the offset direction.

11. The method of claim 10, wherein the first conductor loop and the second conductor loop have respective straight conductor portions that are parallel to the offset direction.

12. The method of claim 11 for detecting the material flaw in the test piece by the eddy current method, wherein the conductor portions are spaced apart from a surface of the test piece.

13. The method of claim 11 for detecting the material flaw in the test piece by the leakage flux method, wherein the conductor portions are in contact with a surface of the test piece.

14. The method of claim 10, wherein during the rotating of the differential probe, a central axis of the through opening extends essentially parallel to the mirror plane or within the mirror plane.

15. The method of claim 10, wherein the at least one differential probe comprises two or a plurality of differential probes that are arranged at essentially identical angular separations around the through opening.

16. The method of claim 10, wherein the at least one differential probe comprises at least two differential probes that are arranged next to each other along the offset direction.

* * * * *